United States Patent [19]

Kitsukawa et al.

[11] Patent Number: 5,587,952
[45] Date of Patent: Dec. 24, 1996

[54] DYNAMIC RANDOM ACCESS MEMORY INCLUDING READ PREAMPLIFIERS ACTIVATED BEFORE REWRITE AMPLIFIERS

[75] Inventors: Goro Kitsukawa, Hinodemachi; Takao Watanabe, Kokubunji; Ryoichi Hori, Hinodemachi; Noriyuki Honma, Kokubunji; Kunihiko Yamaguchi, Sayama; Kiyoo Itoh, Higashikurume, all of Japan

[73] Assignee: Hitachi, Ltd., Tokyo, Japan

[21] Appl. No.: 391,537

[22] Filed: Feb. 21, 1995

Related U.S. Application Data

[60] Continuation of Ser. No. 35,272, Mar. 22, 1993, abandoned, which is a division of Ser. No. 921,385, Jul. 30, 1992, abandoned, which is a continuation of Ser. No. 308,680, Feb. 3, 1989, abandoned, which is a continuation-in-part of Ser. No. 803,673, Dec. 2, 1985, abandoned, and Ser. No. 170,623, Mar. 17, 1988, Pat. No. 4,813,020, which is a continuation of Ser. No. 825,939, Feb. 4, 1986, abandoned.

[30] Foreign Application Priority Data

Dec. 17, 1984 [JP] Japan .................. 59-264466

[51] Int. Cl.⁶ .................. G11C 11/409; G11C 7/06
[52] U.S. Cl. .................. 365/207; 365/190; 365/233
[58] Field of Search .................. 365/190, 205, 365/207, 208, 227, 233

[56] References Cited

U.S. PATENT DOCUMENTS

| | | | |
|---|---|---|---|
| 4,085,457 | 4/1978 | Itoh | 365/205 |
| 4,133,049 | 1/1979 | Shirato | 365/208 |
| 4,479,202 | 10/1984 | Uchida | 365/205 |
| 4,542,483 | 9/1985 | Procyk | 365/205 |
| 4,608,666 | 8/1986 | Uchida | 365/182 |
| 4,748,596 | 5/1988 | Ogura et al. | 365/207 |
| 4,961,166 | 10/1990 | Sato et al. | 365/208 |

FOREIGN PATENT DOCUMENTS

| | | | |
|---|---|---|---|
| 0129651 | 1/1985 | European Pat. Off. | 365/205 |
| 55-87381 | 7/1980 | Japan . | |
| 55-132589 | 10/1980 | Japan | 365/227 |
| 59-60793 | 4/1984 | Japan . | |
| 60-170091 | 9/1985 | Japan | 365/205 |

OTHER PUBLICATIONS

Baba et al, "A 64k DRAM wtih 35ns Static Column Operation," IEEE Jour. of Sol. St. Lcts., vol. SC–18, No. 5, Sep. 1983, pp. 447–451.

*Primary Examiner*—Glenn Gossage
*Attorney, Agent, or Firm*—Antonelli, Terry, Stout & Kraus

[57] ABSTRACT

A dynamic random access memory is provided which includes word lines for accessing memory cells, data lines for transferring information from the memory cells, and rewrite amplifiers connected to the data lines for rewriting the information to corresponding memory cells. Read pre-amplifiers are also provided for sensing the information, together with common data lines for transferring output signals of the read pre-amplifiers. Each of the read pre-amplifiers has two insulated gate field-effect transistors, gates of which are connected to the data lines, and sources/drains of which are connected with the common data lines, such that the common data lines do not form current paths with the data lines. In addition, the read pre-amplifiers are activated before the rewrite amplifiers.

26 Claims, 13 Drawing Sheets

DYNAMIC RANDOM ACCESS MEMORY INCLUDING READ PREAMPLIFIERS ACTIVATED BEFORE REWRITE AMPLIFIERS

This application is a continuation of U.S. patent application Ser. No. 08/035,272, filed Mar. 22, 1993, now abandoned, which is a divisional of application Ser. No. 07/921,385, filed Jul. 30, 1992, now abandoned, which is a continuation of application Ser. No. 07/308,680, filed Feb. 3, 1989, now abandoned, which is a continuation-in-part of application Ser. No. 06/803,673, filed Dec. 2, 1985, now abandoned, and application Ser. No. 07/170,623, filed Mar. 17, 1988, now U.S. Pat. No. 4,813,020, which is a continuation of application Serial No. 06/825,939, filed Feb. 4, 1986, now abandoned.

This application is also related to application Ser. No. 07/764,769, filed Sep. 1991, also now abandoned.

BACKGROUND OF THE INVENTION

The present invention relates to a semiconductor device, and, more particularly, to a composite circuit which is a combination of a MOS (metal-oxide-semiconductor) transistor and a bipolar transistor, or a MOS-drive bipolar-output logic circuit.

Further, the present invention relates to a dynamic semiconductor memory comprising a dynamic memory cell using an insulated-gate field effect transistor and storage capacitance in a memory cell, and a driving circuit using a bipolar transistor having particularly high drivability and high noise immunity and being suitable to obtain pulse output amplitude higher than the supply voltage and an insulated-gate field effect transistor. Further, the invention relates to a method of generating control signals within a chip so that the dynamic memory performs normal operations.

In a semiconductor memory, in order to achieve high speed and high density simultaneously, a memory cell is constituted by an insulated-gate field effect transistor (hereinafter referred to as an "MIS transistor"), and peripheral circuits for transmitting or receiving signals with the memory cell include a bipolar transistor. Examples of the above-mentioned constitution are disclosed in Japanese Patent Application Laid-Open No. 55-12994 and No. 56-5893. In these patents, a flip-flop composed of four MIS transistors and two load-devices is used in a memory cell, and a so-called static memory is constituted. Consequently, the area of the memory cell is relatively large and constitution at high density is difficult. On the other hand, as shown in FIG. 1A and 1B, in a dynamic memory cell using between one and three MIS transistors and storage capacitance for storing information '1', '0' by the amount of the stored charges in the capacitance, the area of the memory cell is small and constitution at high density is favorable. In the semiconductor memory using the dynamic memory cell, however, since the memory cell does not have self reproduction capability of the stored information, read signals to the data line D must be amplified and then rewritten, and the potential of the data line D must be pre-charged to constant voltage before the reading. Consequently, in an actual dynamic memory, in order to perform a memory operation (e.g., read, write, hold), relatively complicated control is required in comparison to static memory arrangements. Accordingly, in the dynamic memory of the prior art, both the memory cell and the peripheral circuits are constituted using MIS transistors, and constitution is at high density but the speed is slow at the access time or the like.

On the other hand, Japanese Patent Application Laid-Open No. 59-75487 describes that in a semiconductor memory where large current must be supplied to word line driving circuits such as a taper isolated dynamic RAM having a memory cell constituted by a MIS transistor with its drain/source connected between a bit line and a word line, use of a driving circuit comprising a bipolar transistor can achieve high density and high speed. Since the memory cell of the taper isolated dynamic RAM is constituted by one MIS transistor, it is favorable from the viewpoint of high density in comparison to the static RAM.

If the high density is further advanced holding the high speed, however, current flowing through the word line driving circuit increases and therefore the bipolar transistor used in the word line driving circuit must be of large size so as to hold high reliability, resulting in an increase of the chip area. Consequently, the merit of high density is deteriorated.

Further, Japanese Patent Application Laid-Open No. 59-25423 discloses a driving circuit in the prior art. The driving circuit is shown in FIG. 1C, and operation and problems thereof will be described. The following description will be performed assuming that voltage Vss of a voltage supply 9 is 0 V. When voltage of an input terminal 1 is 0 V, a p-channel insulated gate field effect transistor 4 is turned on and current flows through the base of a first npn bipolar transistor 7 which is turned on. On the other hand, a second npn bipolar transistor 8 is not turned on because its base potential is 0 V. As a result, current flows through an output terminal 2, and potential of the output terminal 2 rises. The potential of the output terminal 2 becomes a value of voltage Vcc of a positive voltage supply 3 subtracted by base-emitter forward voltage $V_{BE}$ of the first npn bipolar transistor 7. If voltage of the input terminal 1 is changed to the positive supply voltage Vcc, since voltage of the output terminal 2 is $V_{cc}-V_{BE}$ at first, the n-channel insulated gate field effect transistor 6 is turned on and current flows through the base of the second npn bipolar transistor 8 so as to lower the potential of the output terminal. On the other hand, since the p-channel insulated gate field effect transistor becomes cut-off, base current of the first npn bipolar transistor 7 does not flow and the n-channel insulated gate transistor 5 is turned on, whereby charge stored in the base of the first npn bipolar transistor 7 is discharged by the n-channel insulated gate field effect transistor and the npn bipolar transistor 7 rapidly becomes cut-off. As a result, potential of the output terminal 2 is rapidly lowered. Then the potential of the output terminal 2 is determined by threshold voltage Vth of the n-channel insulated gate transistor 6 and base-emitter forward voltage $V_{BE}$ of the second npn bipolar transistor 8, and becomes $V_{BE}$+Vth. If the value becomes negative, the second npn bipolar transistor 8 is saturated and the high speed is deteriorated. Consequently, it is preferable that the value is set to become slightly positive taking into consideration variation in the manufacture condition of the semiconductor device, as described in the patent application.

The circuit in the prior art has a defect in that voltage amplitude of the output terminal cannot be made equal to the amount of the supply voltage. In order to eliminate the defect, flowing-in or flowing-out of current to the output terminal may be performed by insulated gate field effect transistors. In this case, in order to achieve the high speed in similar degree to that using the bipolar transistors, transistors having large channel length and width are required and therefore this method is unfavorable from the viewpoint of high density. As shown in FIG. 1D, either of the bipolar transistors may be displaced by an insulated gate field effect transistor as in the circuit constitution of Japanese Patent Application Laid-Open No. 48-35761. Also in this case, however, it is clear that above-mentioned defect cannot be completely eliminated.

In summary, in the prior art arrangements, logical amplitude becomes small at the BiP side and the density is deteriorated at the MOS side.

Further in a circuit of the prior art as shown in FIG. 1C or FIG. 1D, if potential of the output terminal is abnormally varied, the variation cannot be absorbed. This aspect will be described referring to FIG. 1D. In FIG. 1D, assume that potential of the output terminal 11 is in a steady condition at a value of the voltage Vcc of the positive voltage supply 12 subtracted by the base/emitter forward voltage $V_{BE}$ of the npn bipolar transistor 15. Assume that abnormal potential variation is produced in the output terminal 11 by any cause. If the potential variation tends to lower the potential of the output terminal 11, the npn bipolar transistor 15 is turned on and the potential of the output terminal is restored. However, if the potential variation tends to raise the potential of the output terminal 11, the transistor 15 becomes cut-off. Furthermore, since the input terminal 10 is at 0 V, the N-channel insulated gate field-effect transistor 16 becomes cut-off and therefore the potential variation cannot be absorbed. Although the description has been performed regarding the case that the output terminal 11 is at high level, conditions are similar also in the case that the output terminal 11 is at low level. Furthermore, it is clear that a similar defect exists also in the circuit of FIG. 1C.

Accordingly, the above-described circuits in the prior art have defects in that the output amplitude is less than the amount of the supply voltage and potential of the output terminal is subject to variation.

A further discussion of the composite circuits which utilize a low power consumption of CMOS transistors and a high load drive capability of bipolar transistors will now be discussed.

One of those, which is shown in FIG. 12, is a circuit similar to one shown in FIG. 8 of the IEEE Transaction on Electron Devices, Vol. ED-16, No. 11, Nov. 1969, page 950. In FIG. 72, numeral 301 denotes a PMOS transistor having a source thereof connected to a power supply +V, a gate thereof connected to an input terminal IN and a drain thereof connected to a base of an NPN transistor 303, and numeral 302 denotes an NMOS transistor having a drain thereof connected to an output terminal OUT, a gate thereof connected to the input terminal IN and a source thereof connected to a base of an NPN transistor 304. A collector of the NPN transistor 303 is connected to the power supply +V and an emitter thereof is connected to the output terminal OUT. A collector of the NPN transistor 304 is connected to the output terminal OUT and an emitter thereof is connected to a common potential point or a ground potential point GND.

The operation of the circuit is as follows. When the input terminal IN is at an "L" level, the NMOS transistor 302 is off and the NPN transistor 304 is also off. On the other hand, the PMOS transistor 301 is on and a base current is supplied to the NPN transistor 303 through the PMOS transistor 301. As a result, a charge current flows from the NPN transistor 303 to a load (not shown) and the output terminal OUT is switched to an "H" level. When the input terminal IN is at the "H" level, the PMOS transistor 301 is off and the NPN transistor 303 is also off. On the other hand, the NMOS transistor 302 is on and a base current is supplied to the NPN transistor 304 through the NMOS transistor 302 and the NPN transistor 304 is turned on. As a result, the charge stored in the load is discharged through the NPN transistor 304 and the output terminal OUT is switched to the "L" level. In this circuit, an output voltage level of the circuit is shifted by base-emitter voltages $V_{BEQ1}$ and $V_{BEQ2}$ of the NPN transistors 303 and 304. Thus, the "H" level is (+V−$V_{BEQ1}$) and the "L" level is $V_{BEQ2}$.

FIG. 13 shows a circuit similar to one disclosed in Japanese Patent Unexamined Publication No. 54-148469. In FIG. 13, numeral 305 denotes a PMOS transistor having a source thereof connected to a power supply +V, a gate thereof connected to an input terminal IN and a drain thereof connected to a junction point or node B of a base of an NPN transistor 307 and a base of a PNP transistor 308. Numeral 306 denotes an NMOS transistor having a drain thereof connected to said junction point, a gate thereof connected to the input terminal IN and a source thereof connected to a power supply −V. A collector of the NPN transistor 307 is connected to the power supply +V and an emitter thereof is connected to an output terminal OUT. An emitter of the PNP transistor 308 is connected to the output terminal OUT and a collector thereof is connected to the power supply −V.

In this circuit, an output voltage level is also shifted by base-emitter voltages $V_{BEQ1}$ and $V_{BEQ2}$ of the NPN transistor 307 and the PNP transistor 308. Thus, the "H" level is (+V−$V_{BEQ1}$) and the "L" level is (−V+$V_{BEQ2}$).

FIG. 14 shows a circuit similar to one disclosed in Japanese Unexamined Patent Application No. 52-26181. In FIG. 14, numeral 309 denotes a PMOS transistor having a source thereof connected to a power supply +V, a gate thereof connected to an input terminal IN and a drain thereof connected to a base of an NPN transistor 311. Numeral 310 denotes an NMOS transistor having a drain thereof connected to an output terminal OUT, a gate thereof connected to an input terminal IN and a source thereof connected to a power supply −V. A collector of the NPN transistor 311 is connected to the power supply +V and an emitter thereof is connected to the output terminal OUT.

In this circuit, an output voltage level is also shifted by base-emitter voltage $V_{BEQ1}$ of the NPN transistor 311. Thus, the "H" level is (+V−$V_{BEQ1}$) and the "L" level is −V.

In FIG. 15, numeral 312 denotes a symbol of a MOS-drive bipolar-output logic circuit having offsets at the output Levels shown in FIGS. 12–14.

FIG. 16 shows a MOS-drive bipolar-output tri-state circuit 313 which is similar to the circuit of FIG. 20 disclosed in U.S. patent application Ser. No. 06/703,171 entitled "Arithmetic Operation Unit and Arithmetic Operation Circuit" filed Feb. 19, 1985, now U.S. Pat. No. 4,789,958, in the name of Hitachi, Ltd., based on Japanese Patent Applications Nos. 59-31257 filed on Feb. 20, 1984 and 60-2020 filed on Jan. 11, 1985. In the figure, numerals 314 and 315 denote series-connected PMOS transistors, a source of the PMOS 314 is connected to a power supply +V and a gate thereof is connected to an input terminal $\overline{E}$. A gate of the PMOS transistor 315 is connected to an input terminal IN and a drain thereof is connected to a base of a NPN transistor 318. Numerals 316 and 317 denote series-connected NMOS transistors. A drain of the NMOS transistor 316 is connected to an output terminal OUT and a gate thereof is connected to the input terminal IN. A gate of the NMOS transistor 317 is connected to an input terminal E and a source thereof is connected to a base of an NPN transistor 319. A collector of the NPN transistor 318 is connected to the power supply +V and an emitter thereof is connected to the output terminal OUT. A collector of the NPN transistor 319 is connected to the output terminal OUT and an emitter thereof is connected to a ground GND, a load capacitor $C_L$ is connected to the output terminal OUT.

This circuit is a tri-state logic circuit and the output level is shifted. The operation is as follows.

When the input terminal E is at the "L" level and the input terminal $\overline{E}$ is at the "H" level, the PMOS transistor 314 and the NMOS transistor 317 are off, and the NPN transistor 318 and the NPN transistor 319 are also off. As a result, the output terminal OUT is in a high impedance state regradless of the level of the input terminal IN.

When the input terminal E is at the "H" level and the input level $\overline{E}$ is at the "L" level, the NMOS transistor 317 and the PMOS transistor 314 are on. If the input terminal IN is at the "L" level, the PMOS transistor 315 and the NPN transistor 318 are on and the output terminal OUT is charged to $(+V-V_{BEQ1})$. If the input terminal IN is at the "H" level, the NMOS transistor 316and the NPN transistor 319 are on and the output terminal OUT is discharged to $+V_{BEQ2}$. Thus, this circuit functions as an inverter having an output "H" level thereof shifted down by $V_{BEQ1}$ and an output "L" level thereof shifted up by $V_{BEQ2}$.

In FIG. 17, numeral 320 denotes a symbol of the circuit of FIG. 16.

The MOS-bipolar composite circuits described above are different from a CMOS transistor buffer circuit in that they can switch a large capacitive load at a high speed and the output voltage level is shifted by the base-emitter voltage $V_{BE}$ of the bipolar transistor.

However, when such an output voltage level shifted signal is used as a gate drive signal of a MOS switch, the MOS switch may not be completely turned off in a certain circuit. A typical MOS switch circuit in which such a problem may arise is a well-known clocked inverter shown in FIG. 18. A numeral 321 in FIG. 19 denotes a symbol of FIG. 18.

In FIG. 18, numeral 322 denotes a PMOS transistor having a source thereof connected to a power supply +V, a gate thereof connected to an input terminal IN and a drain thereof connected to a source of a PMOS transistor 323. A gate of the PMOS transistor 323 is connected to a clock terminal $\overline{\phi}$ and a drain thereof is connected to an output terminal OUT. Numeral 324 denotes an NMOS transistor having a drain thereof connected to the output terminal OUT, a gate thereof connected to a clock terminal $\phi$ and a source thereof connected to a drain of an NMOS transistor 325. A gate of the NMOS transistor 325 is connected to the input terminal IN and a source thereof is connected to a common potential point GND, $C_s$ denotes a stray capacitance at the output terminal OUT.

The operation of this circuit is as follows. When $\phi$ is at the "H" level and $\overline{\phi}$ is at the "L" level, the PMOS transistor 323 and the NMOS transistor 324 are on. If the input terminal IN is at the "L" level, the NMOS transistor 325 is off and the PMOS transistor 322 is on, and the stray capacitance $C_s$ is charged through the PMOS transistors 322 and 323 so that the output terminal OUT assumes the "H" level. On the other hand, if the input terminal IN is at the "H" level, the PMOS transistor 322 is off and the NMOS transistor 325 is on, and the charge stored in the stray capacitor $C_s$ is discharged through the NMOS transistors 324 and 325 so that the output terminal OUT assumes the "L" level.

When $\phi$ is at the "L" level and $\overline{\phi}$ is at the "H" level, the PMOS transistor 223 and the NMOS transistor 324 are off. Thus, the level of the output terminal is held irrespective of the level of the input terminal IN. Thus, this circuit has a dynamic latch function.

However, when the clocks $\phi$ and $\overline{\phi}$ are supplied from the prior art composite circuit shown in FIGS. 12 to 14 or the composite circuit shown in FIG. 16 which is not prior art, the operation in the hold state is as follows. Let us assume that the power supply +V is 5 volts, the "H" levels of $\phi$ and $\overline{\phi}$ are 4.3 volts, the "L" levels thereof are 0.7 volt, the "H" level of the input terminal IN is 5 volts and the "L" level thereof is 0 volt.

When $\phi=0.7$ volt, $\overline{\phi}=4.3$ volt and the output terminal OUT is held at the "H" level, the PMOS transistor 323 and the NMOS transistor 324 conduct slightly because the gate-source voltages thereof are not completely zero. If the input terminal IN is at the "L" level, the NMOS transistor 325 is off and the PMOS transistor 322 is on. Therefore, the output terminal OUT is held at the "H" level. If the input terminal IN is at the "H" level, the NMOS transistor 325 is on and the charge stored in the stray capacitor $C_S$ is discharged through the slightly conducting NMOS transistor 324 and the on NMOS transistor 325. As a result, the output terminal OUT is switched from the "H" level to the "L" level. Similarly, when the output terminal OUT is held at the "L" level and the input terminal IN is at the "L" level, the NMOS transistor 325 is off and the PMOS transistor 322 is on. As a result, the charge stored in the stray capacitor $C_S$ is charged through the PMOS transistor 322 which is now in on state and the slightly conducting PMOS transistor 323 so that the output terminal OUT is switched from the "L" level to the "H" level.

Thus, in the prior art composite circuits, the output terminal OUT is not completely "L" level, that is, the level of the output terminal OUT does not completely reach the common potential or the lower potential of the power supply when the output terminal OUT is at the "L" level, and the output terminal OUT is not completely "H" level, that is, the level of the output terminal does not reach the higher potential of the power supply when the output terminal OUT is at the "H" level. This adversely affects to the succeeding stage circuit.

In a circuit shown in Japan Patent Unexamined Publication No. 59-205828 (FIG. 4 in particular), a logic circuit which is a composite circuit comprising MOS transistors and bipolar transistor and another logic circuit comprising MOS transistors and having the same function as the first logic circuit are connected in parallel so that the output signal level completely reach the "L" or "H" level. In this circuit, since an input capacitance is larger than that of a logic circuit which comprises only the composite circuit, an operation speed of a preceding circuit to drive the logic circuit is lower and hence an overall speed is reduced. Furthermore, in a multi-input buffer circuit, the number of elements required for the parallel MOS logic circuit increases in proportion to the number of inputs.

Reference may be made to U.S. patent application Ser. No. 06/680,495 filed Dec. 11, 1984 in the name of Hitachi, Ltd., now U.S. Pat. No. 4,769,561, and to Japanese Patent Unexamined Publication No. 59-205828.

SUMMARY OF THE INVENTION

In view of the above-mentioned disadvantages in the prior art, an object of the invention is to provide a semiconductor memory of high speed and large capacity.

It is an object of the present invention to provide a logic circuit or semiconductor device which is constructed by a composite circuit comprising MOS transistors and bipolar transistors and which is free from a level shift of an output signal, that is, in which the output signal is at a completely low level, or common potential or one of power supply voltages when the output signal is at an "L" level, and the output signal is at a completely high level, or the other power supply voltage when the output voltage is at an "H" level, and which can switch a large capacitive load at a high speed.

The invention relates to a method of generating control signals in a memory chip of a semiconductor memory composed of a dynamic memory cell and peripheral circuits including a bipolar transistor, and is directed to provide a dynamic semiconductor memory of large capacity and high speed.

In view of disadvantages in the above-mentioned circuit system in the prior art, another object of the invention is to provide a driving circuit which has the high driving capability of a bipolar transistor and which is immune from noise and can obtain amplitude larger than the supply voltage.

According to the invention, in a semiconductor memory comprising a memory cell for storing information and peripheral circuits in which signals are transmitted to or received from the memory cell, the memory cell to be used is a dynamic memory cell which may be constituted by a small number of MIS transistors and particularly can prevent large current from flowing therein through word lines. The peripheral circuits are constituted to include bipolar transistors, whereby high-speed operation and large capacity can be achieved.

Further in accordance with the present invention a semiconductor device is provided having at least one MOS transistor, at least one bipolar transistor adapted to be driven by said MOS transistor, and an output terminal connected to a collector of an emitter of said bipolar transistor. A logical inverter receives a signal at said output terminal and an MOS transistor is provided having a source and a drain thereof parallelly connected across the collector and the emitter of said bipolar transistor. The MOS transistor is adapted to be turned on and off by an output signal of said logical inverter means so that a level-shiftless output is produced.

Further in the invention, the load driving can be performed concurrently by a bipolar transistor and an insulated gate field-effect transistor. Thus, the bipolar transistor performs the high-speed driving, the insulated gate field-effect transistor puts the output terminal at a low-impedance state and provides the immunity from noise, and the output amplitude is obtained without being restricted by the base-emitter forward voltage $V_{BE}$ of the bipolar transistor.

Further according to the invention, an external chip select signal ($\overline{CS}$ in FIG. 2) is used, whereby driving signals suitable for a dynamic memory or control signals of peripheral circuits are generated. In the following description, the chip select signal $\overline{CS}$ is used for controlling, and it is assumed that when the signal is at high potential the device is at a stand-by state or precharge state, and when the signal is at low potential it performs reading or writing. Regarding the name and the polarity of the control signal, even if it is specified to any state, a remedy here is possible by simple changing. Input/output interface is ECL unless otherwise specified. Changing from ECL to TTL is possible by simply changing the input buffer/output buffer and the polarity of the supply voltage.

Further according to the invention, in order to achieve a semiconductor memory of large capacity and high speed, a dynamic semiconductor memory including bipolar transistors at peripheral circuits is provided. That is, dynamic memory cells composed of one or a small number of insulated gate transistors and storage capacitance are used as memory cells to store information, and bipolar transistors are used in peripheral circuits to transmit signals to or receive signals from the memory cell whereby the read/write operation is performed at high speed and high sensitivity.

In accordance with still another aspect of the present invention, there are provided logical inverting means connected to an output terminal of a composite circuit comprising MOS transistors and bipolar transistors driven by the MOS transistors for inverting a level of an output signal, and MOS transistors each having a source and a drain thereof connected in parallel between a collector and an emitter of a corresponding one of the bipolar transistors in the output stage of the composite circuit and adapted to be turned on and off by the output signal of the logical inverting means. When the bipolar transistors conduct with voltage drops corresponding to base-emitter voltages, they are completely conducted by the MOS transistors.

In the present invention, the term complete "L" level means the common potential or one of the power supply voltages, and the term complete "H" level means the other power supply voltage.

Other and further objects, features and advantages of the invention will appear more fully from the following description.

DETAILED DESCRIPTION OF THE INVENTION

In the present specification and claims, terms "input terminal", "output terminal" and "terminal" are defined as electrical connecting terminals including junction points of patterns on an integrated circuit device.

Embodiment 1

Figure 2:
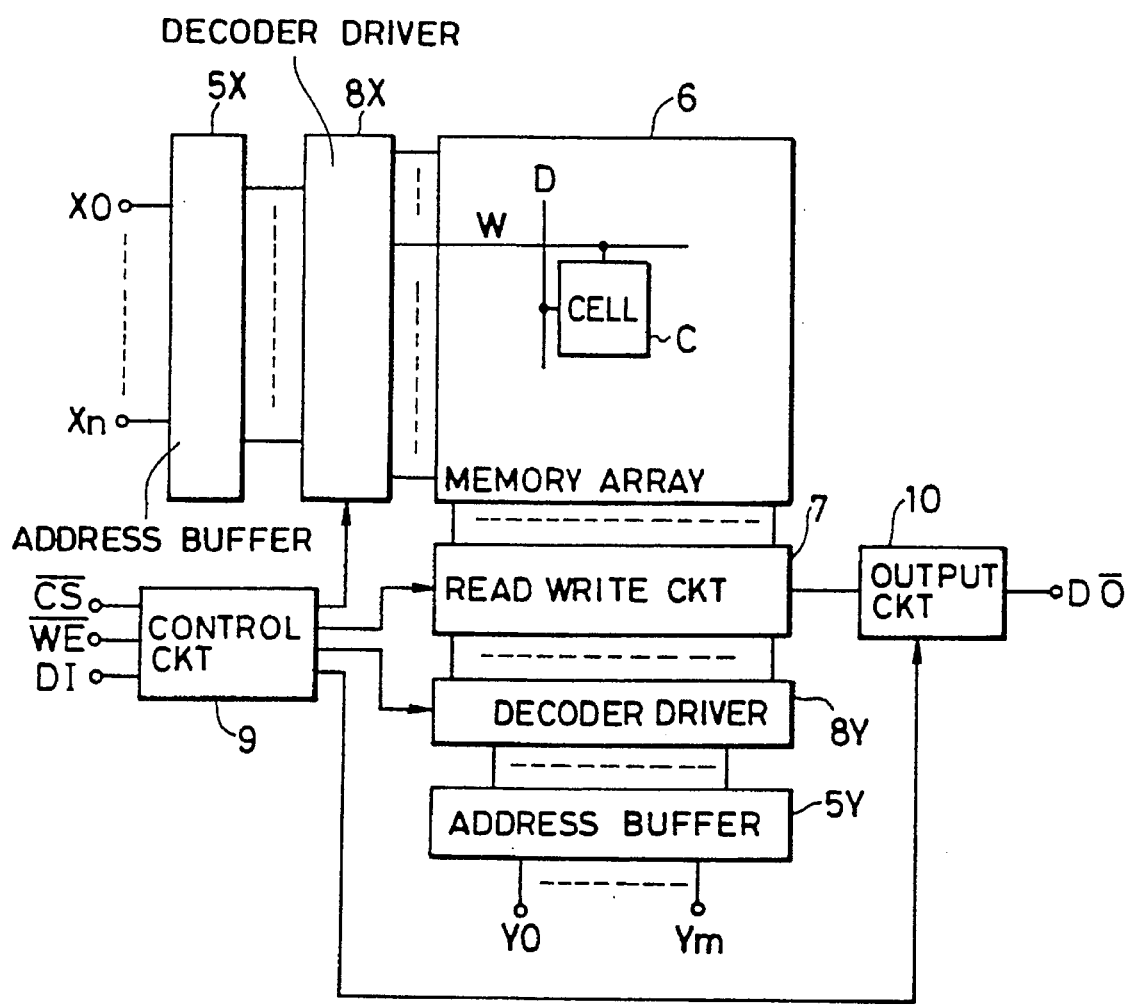
FIGS. 2–11 are diagrams illustrating a first embodiment of the invention.

FIG. 2 is a block diagram of an N-bit dynamic semiconductor memory as a first embodiment of the invention, wherein a dynamic memory cell is composed of MIS transistors used as memory cells so as to achieve high capacity, and bipolar transistors are used in peripheral circuits to receive signals from or transmit signals to the memory cell so as to achieve high speed. In FIG. 2, peripheral circuits including a memory cell array 6 of N bits and bipolar transistors are shown. In the memory cell array 6, word lines W of i in number and data lines D of j in number are crossed to each other, and memory cells C are arranged at N points among the cross-points between the word lines W and the data lines D. Address inputs $X_0$-Xn, $Y_0$-Ym are inputted to address buffer circuits 5X, 5Y respectively, and outputs of the circuits 5X, 5Y are transferred to decoder/driver circuits 8X, 8Y. Among the decoder/driver circuits 8X, 8Y, circuit 8X drives the word line W, and circuit 8Y drives the write/read circuits 7. Thereby information is written into a selected memory cell C within the memory array or read out of the memory cell C. Numeral 9 designates a write/read control circuit which controls the decoder/driver circuits 8X, 8Y, the write/read circuit 7 and an output circuit 10 by the chip select signal $\overline{CS}$, the write control signal $\overline{WE}$ and the input signal $\overline{DI}$. The output circuit 10 is a circuit to output information outward which is read by the write/read circuit 7. A part of the write/read circuit 7 may be disposed at an end of the memory cell array 6 on an opposite side from the decoder/driver circuit 8Y as hereinafter described so that control signals from the decoder/driver circuit 8Y are controlled through the memory cell array 6. In FIG. 2, although address inputs $X_0$-Xn in X-system and address inputs $Y_0$-Ym in Y-system are inputted through separate input terminals, a system that these input terminals are made common and the address inputs are inputted at the time difference, which is the so-called 'address multiplexing configuration', may be adopted. In the following description, the external interface is emitter coupled logic (hereinafter referred to as "ECL") level unless otherwise specified. However, the invention can be applied also to transistor transistor logic (hereinafter referred to as "TTL").

Figure 1A:
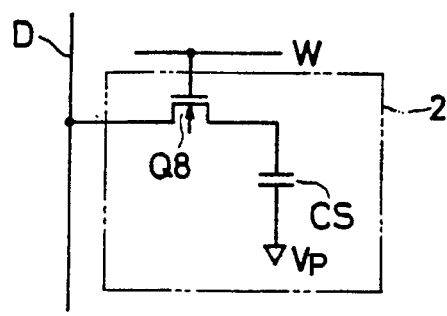
FIGS. 1A–1D are circuit diagrams illustrating circuits in the prior art.
Figure 1B:
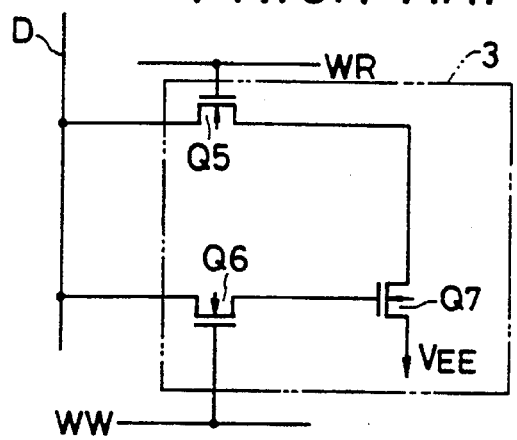
Figure 1C:
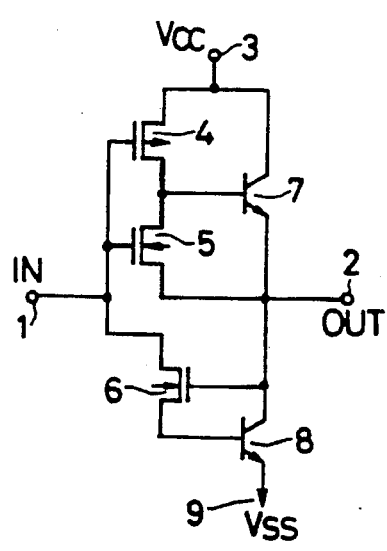
Figure 1D:
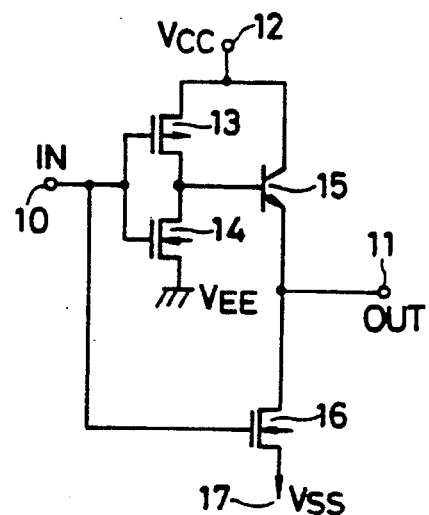

The supply voltage is $V_{EE}$ ($\cong$−5.2 V) at ECL and $V_{cc}$ ($\cong$+5 V) at TTL. In the following embodiment, although a dynamic memory cell having one MIS transistor shown in FIG. 1A is used as memory cell C, the invention is not limited to using this type of memory cell but can be applied also to a dynamic memory cell where a word line is connected to gate of MIS transistors, for example, a memory cell using three MIS transistors as shown in FIG. 1B. These memory cells have been used in a dynamic semiconductor memory constituted by MIS transistors including peripheral circuits. The memory cell as shown in FIG. 1A, FIG. 1B may be constituted using a P-channel MIS transistor.

The write/read circuit 7 and the output circuit 10 among the above-mentioned circuits will now be described specifically.

First, a sense circuit 11 and the output circuit 10 shown in FIG. 3A, FIG. 3B will be described. The sense circuit 11 together with a write circuit 12 as hereinafter described constitutes the write/read circuit 7, and performs information read operations and re-write operations as hereinafter described. The sense circuit 11 is constituted by sub-sense circuits 11S each installed per a pair of data lines D, $\overline{D}$ in the memory cell array 6. In the sub-sense circuit 11S, symbol HP designates a precharge circuit, symbol SA1 a first differential amplifier, and symbol SA2 a second differential amplifier. Output of the sub-sense circuit 11S is transferred through output lines O, $\overline{O}$ grounded by resistors R3, R4 to the output circuit 10 including bipolar transistors. FIG. 3B shows a constitution example of the output circuit 10 in FIG. 3A. N-channel MIS transistors Q17, Q19 in the first differential amplifier SA1 have been called a sense amplifier, and P-channel MIS transistors Q16, Q18 have been called an active restore circuit. These are a sort of amplifier and therefore generally called the first differential amplifier SA1 here.

Next, the read operation by the sense circuit 11 and the output circuit 10 shown in FIG. 3A, FIG. 3B will be described referring to FIG. 4. Before starting the read operation, potential of the line H for charging and the line L for discharging both connected to the first differential amplifier SA1 set to potential to turn the MIS transistors Q16–Q19 off, e.g., ½ $V_{EE}$ thereby the first differential amplifier SA1 is turned off, and the precharge signal φP is set to high level whereby the precharge circuit HP is activated. As a result, the N-channel MIS transistors Q11, Q12, Q13 are turned on by the precharge signal φP, whereby a pair of data lines such as $D_0$, $\overline{D}_0$ or $D_1$, $\overline{D}_1$ are shortcircuited and at the same time the potential is set to the precharge voltage $V_H$. The precharge voltage $V_H$ is specified to a value of about a half of the negative supply voltage $V_{EE}$. If the chip select signal $\overline{CS}$ becomes low level and the read operation is started, the chip select signal $\overline{CS}$ is detected and the precharge signal φp is lowered thereby the precharge circuit HP is turned off, and the word line $W_0$ and the Y-select signal $\phi_{y0}$ selected by the address signals $X_0$-Xn, $Y_0$-Ym Ym are transferred to high level. Then non-select word lines which are not shown in FIG. 3A and Y-select signals such as φY1 of non-select pair of data lines D1, $\overline{D}_1$ are set to low level. If potential of the word line $W_0$ becomes high level, the MIS transistors Q8 of all memory cells 2 (FIG. 1A) connected to the line $W_0$ are turned on, and charge flows between the capacitance $C_c$ and the data line to which the memory cells 2 are connected whereby the potential of the data line slightly varies. Noticing the pair of data lines $D_0$, $\overline{D}_0$, as a result of above-mentioned situation, potential of the data line $D_0$ varies and potential of the data line $\overline{D}_0$ remains to be the precharge voltage $V_H$. For example, if potential of high level (0 V) is stored in the capacitance $C_c$ of the memory cell connected to the data line $D_0$ and the word line W0, the potential of the data line $D_0$ becomes a little higher than that of the line $\overline{D}_0$ as shown in solid line of FIG. 4. As a result, current flowing through the resistor R4 (FIG. 3A) to the MIS transistor Q21 of the second differential amplifier SA2 becomes more than current flowing through the resistor R3 to the MIS transistor Q22, whereby potential of the output line $\overline{O}$ becomes lower than that of the output line O. Then the second differential amplifier SA2 connected to non-select pairs of data lines other than the pair of data lines Do, $\overline{D}$o does not act, because the Y-select signal such as φY1 is at low level. Voltage difference produced between the output lines O, $\overline{O}$ is transferred to the output circuit 10 shown in FIG. 3B, and voltage difference is produced at the base of the bipolar transistors Q50, Q51. The potential of the output lines O, $\overline{O}$ is lowered respectively by means of the bipolar transistor Q50, the diode QD1 and the bipolar transistor Q51, the diode QD2 by twice ef the base-emitter forward voltage $V_{BE}$, i.e., about 1.6 V, and then applied to the base of the bipolar transistors Q52, Q53. Since the potential of the output line O is higher than that of the output line $\overline{O}$, the bipolar transistor Q52 is turned on and the bipolar transistor Q53 is turned off. Thus current by a constant current source $I_3$ flows mainly through the bipolar transistor Q52, and base potential of the bipolar transistor Q54 rises so that a high level voltage is outputted to the output DO. In the output circuit 10, the input voltages are lowered by means of the bipolar transistors Q50, Q51 and the diodes QD1, QD2, so as to prevent the bipolar transistors Q52, Q53 from saturating. By these bipolar transistors Q50, Q51, capacitance of the metals 26, 27 is reduced to about the reciprocal of the dc current gain $h_{FE}$ of the bipolar transistor as the load of the second differential amplifier SA2. This promotes the high speed and increases the degree of freedom of the layout. In the output circuit 10, detection of the voltage difference of the output lines O, $\overline{O}$ is performed by the bipolar transistors Q52, Q53. Thus the voltage difference produced between the output lines O, $\overline{O}$ can be detected among as small a voltage difference as several tens mV and then outputted. Since a bipolar transistor is used as output transistor Q54, the large driving capability can be easily obtained. Although the read operation has been described regarding so-called "1-read" where high level is outputted to the output DO, the condition is similar to "0-read" where a low level is outputted to the output DO as shown in broken lines in FIG. 4. If the output circuit 10 is slightly changed, potential of the output DO can be controlled during the stand-by or during the write operation as hereinafter described using signals of the control circuit 9 shown in FIG. 2. Further, so-called dummy cells may be installed per each data line, of course, so that noise by coupling with the data line during the word line rising is reduced and the signal amount is equalized at "0-read" and "1-read". The precharge circuit HP may be constituted by the P-channel MIS transistor by suitably setting the precharge signal φP and the precharge voltage $V_H$. The memory cell 2 as shown in FIG. 1A is used in the embodiment. In such a memory cell, as is known well, the re-write operation is required after the read operation. In other words, if the word line potential is transferred to high level in the read operation, the memory cell capacitance $C_c$ and the data line are shortcircuited in all memory cells connected to the word line, whereby the potential of the memory cell $C_c$ varies. Consequently, the potential of the memory cell capacitance $C_c$ must be restored in order to hold the storage information. Consequently, the small voltage difference produced between the pair of data lines is amplified regarding all pairs of data lines, and the data line potential at the higher side is transferred to 0 V and that at lower side is transferred to $V_{EE}$, thereby the potential of the memory cell capacitance $C_c$ shortcircuited by the data line may be restored. In the embodiment, the re-write operation is performed by the first differential amplifier SA1. That is, in FIG. 4, after the small voltage difference is produced between the pair of data lines, the line H for charging connected to the first differential amplifier SA1 is driven to 0 V and the line L for discharging is driven to $V_{EE}$ by the driving circuits 15, 16 (FIG. 3A). Among a pair of P-channel MIS transistors Q16, Q18 to constitute the flip-flop, mutual conductance gm of the P-channel MIS transistor with gate connected to the data line at lower side is larger than that of the P-channel MIS transistor with gate connected to the data line at higher side. Further among a pair of N-channel MIS transistors Q17, Q19 to constitute the flip-flop, mutual conductance gm of the N-channel MIS transistor with gate connected to the data line at higher side is larger than that of the N-channel MIS transistor with gate connected to the data line at lower side. Accordingly, current flows into the data line at higher side from the line H for charging, and current flows out of the data line at lower side through the line L for discharging. As a result, the small voltage difference produced between the pair of data lines is amplified, thereby the difference of the mutual conductance is increased. Thus when the data line potential at higher side attains to 0 V and the data line potential at lower side attains to $V_{EE}$, the re-write operation is finished. Since the first differential amplifier SA1 is constituted by the MIS transistors, it has the small area and therefore the layout between the pair of data lines is easy. Furthermore, since the data lines are charged by the P-channel MIS transistors Q16, Q18 and discharged by the N-channel MIS transistors Q17, Q19, potential of the data lines may be amplified fully to the supply voltage irrespective of the threshold voltage of the MIS transistors. Consequently, level of re-write to the memory cell capacitance $C_c$ becomes high and the apparatus becomes immune from soft error due to α-particles. When the re-write operation is finished, since the potential at one of the pair of data lines becomes 0 V, a voltage higher than the threshold voltage $V_{TH}$ of the MIS transistors may be applied to gate of the MIS transistor Q21 or Q22 connected to the non-select data line and to the node connected to the output line depending on how the second differential amplifier SA2 is designed. In this case, increase of the capacitance of the output lines O, $\overline{O}$ may adversely affect the read operation. Then the resistors R3, R4 and the second differential amplifier SA2 may be designed so that the potential of the output lines O, $\overline{O}$ is not lowered over the threshold voltage $V_{TH}$ of the MIS transistors Q21, Q22.

As above described, in the embodiment, the two differential amplifiers are installed per pair of the data lines, and the first differential amplifier SA1 performs the re-write operation and the second differential amplifier SA2 reads information to the output circuit 10 through the output lines O, $\overline{O}$. In the output circuit 10, the voltage difference read to the output lines O, $\overline{O}$ as above described can be detected at high sensitivity and high speed by the bipolar transistors and then outputted. Accordingly, the output DO can be obtained through the second differential amplifier SA2 before the first differential amplifier SA1 for the re-write operation finishes. As shown in FIG. 2, since the pair of data lines are connected to gate of the MIS transistors Q21 and Q22 in the second differential amplifier SA2, current does not flow to the second differential amplifier SA2 through the data lines. Even if the second differential amplifier SA2 is started before the starting of the differential amplifier SA1, the data line potential does not vary and there is no fear of the error of the first differential amplifier SA1. If the word line remains to be at high level and the Y-select signal such as $\phi_{Y0}$, $\phi_{Y1}$ to start the second differential amplifier is changed, information from the pair of data lines connected to the second differential amplifier which is newly started can be read in the output lines O, $\overline{O}$. Consequently, if the word line remains to be at high level and the Y-select signal is changed, information of the memory cell connected to the word line can be read continuously. That is, the page mode operation or the static column mode operation as known well can be performed.

Figure 5:
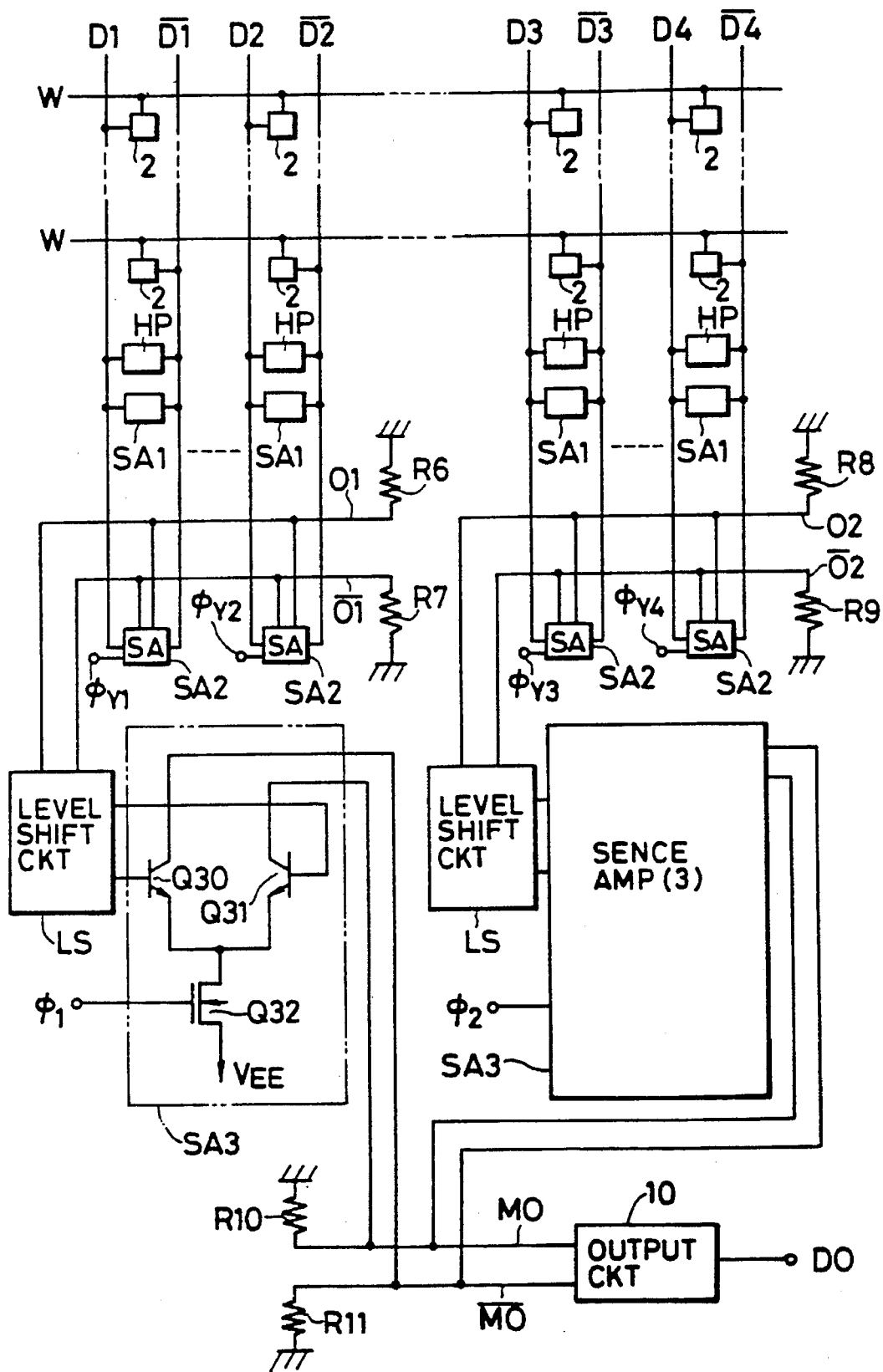

The output circuit 10 shown in FIG. 3B acts if the voltage difference produced between the output lines O, $\overline{O}$ by the second differential amplifier SA2 attains to about several tens mV. However, requirement to increase the voltage difference between the output lines O, $\overline{O}$ to some degree may occur depending on characteristics of the bipolar transistor of the output circuit. In order to achieve this without loss of speed, as shown in FIG. 5, a third differential amplifier SA3 including bipolar transistors may be installed per plural data lines. In FIG. 5, the output lines O1, $\overline{O1}$ or O2, $\overline{O2}$ are connected to the output circuit 10 through the level shift circuit LS and the third differential amplifier SA3 installed per plural pair of data lines. Further in FIG. 5 the level shift circuit LS serves to equally lower the potential of the output lines O1, $\overline{O1}$ or O2, $\overline{O2}$ so that the bipolar transistors Q30, Q31 of the third differential amplifier SA3 are not saturated. The third differential amplifier SA3 is controlled by signal $\phi_1$ or $\phi_2$ applied to gate of the MIS transistor Q32. For example, when the memory cell connected to the pair of data lines D1, $\overline{D1}$ is selected and $\phi_{Y1}$, $\phi_1$ are transferred to high level, information from the memory read as voltage difference between the output lines O1, $\overline{O1}$ is transmitted to the output circuit 10 by the third differential amplifier. Also when information read in the data line D3, $\overline{D3}$ is transmitted to the output circuit 10, $\phi_{Y3}$ and $\phi_2$ may be transferred to high level. According to above-mentioned constitution, even when the voltage difference required for input of the output circuit 10 is large, the read operation at high speed can be performed by the third differential amplifier SA3 constituted by the bipolar transistors. Since the output lines O, $\overline{O}$ are installed per plural data lines, parasitic capacitance due to the output lines connected to the second differential amplifier SA2 can be reduced.

Figure 3A:
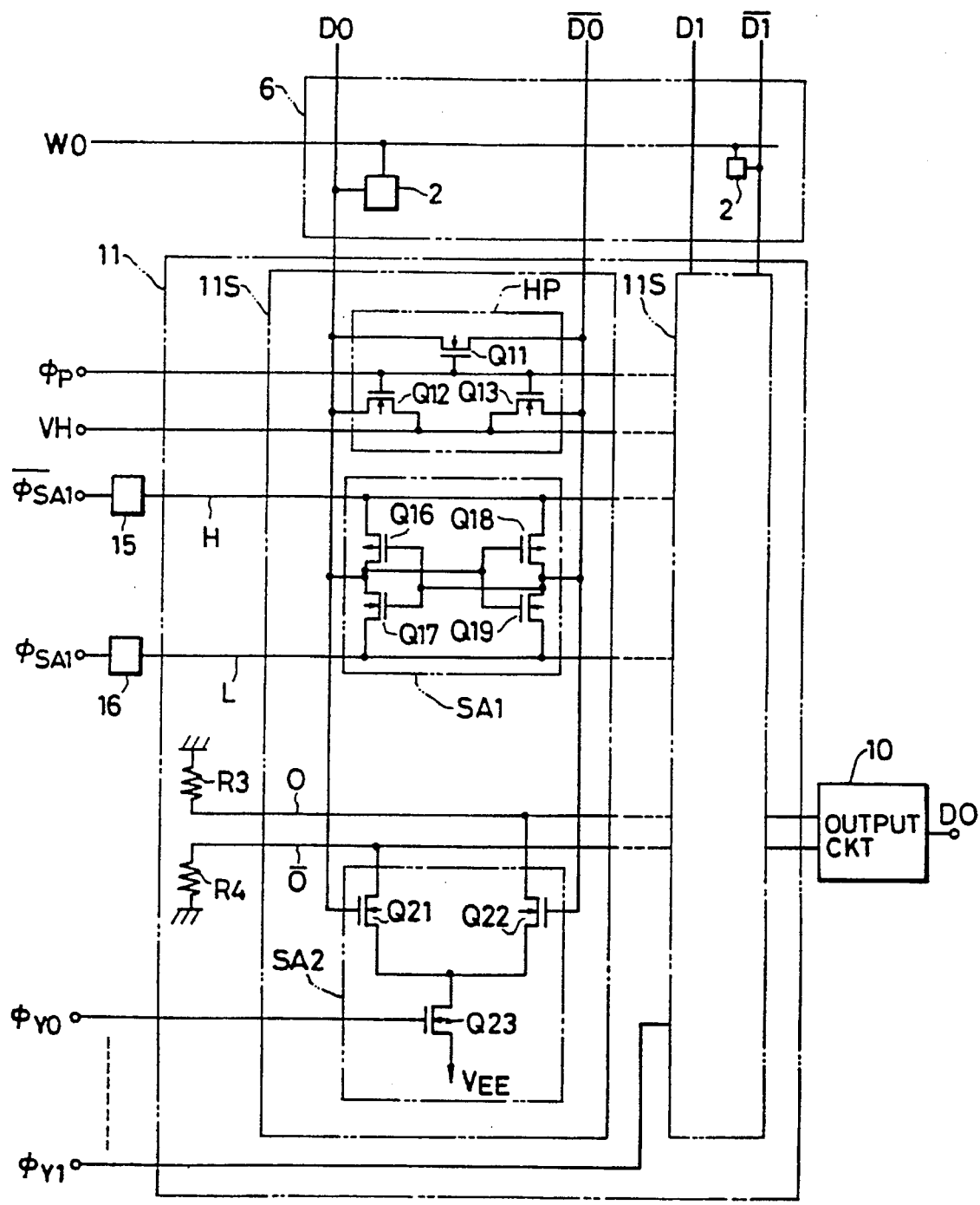
Figure 3B:
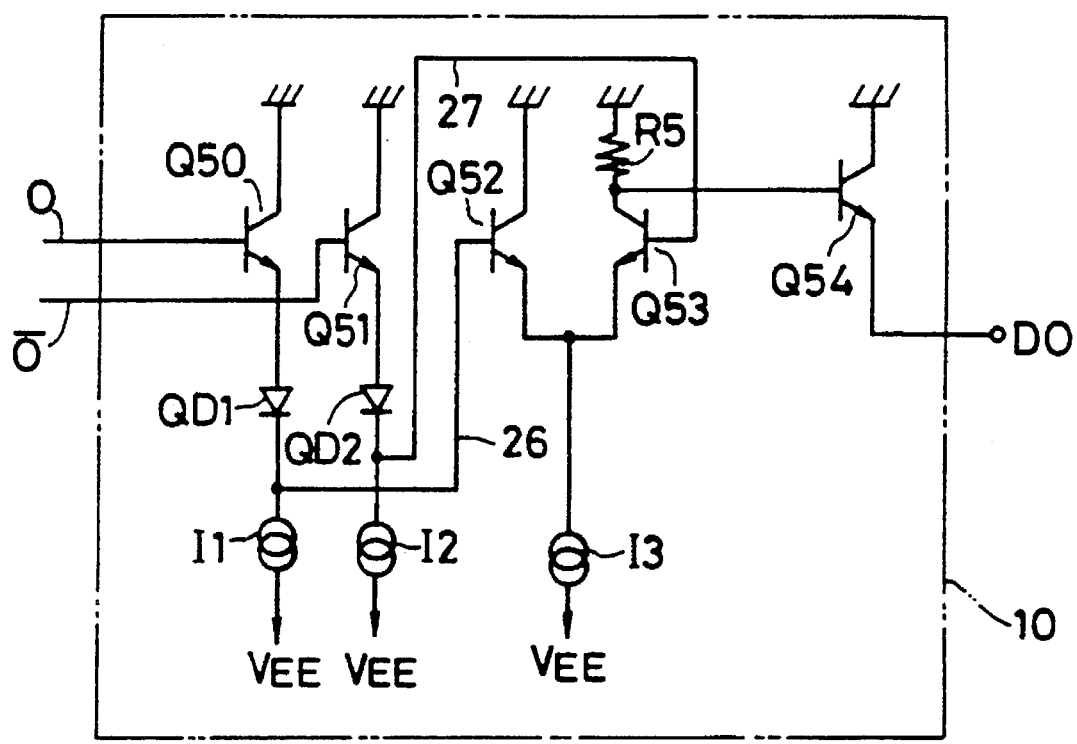
Figure 4:
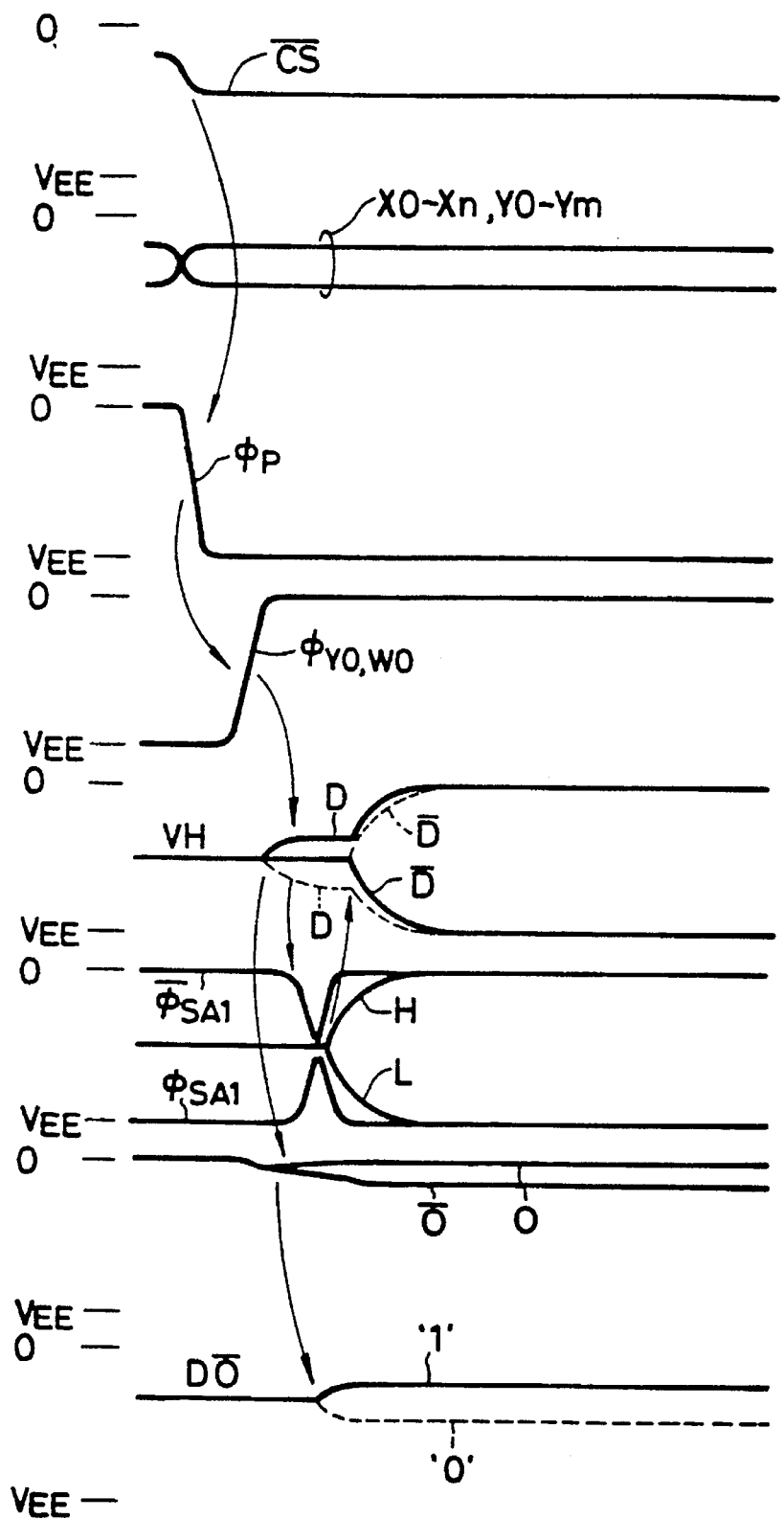
Figure 6:
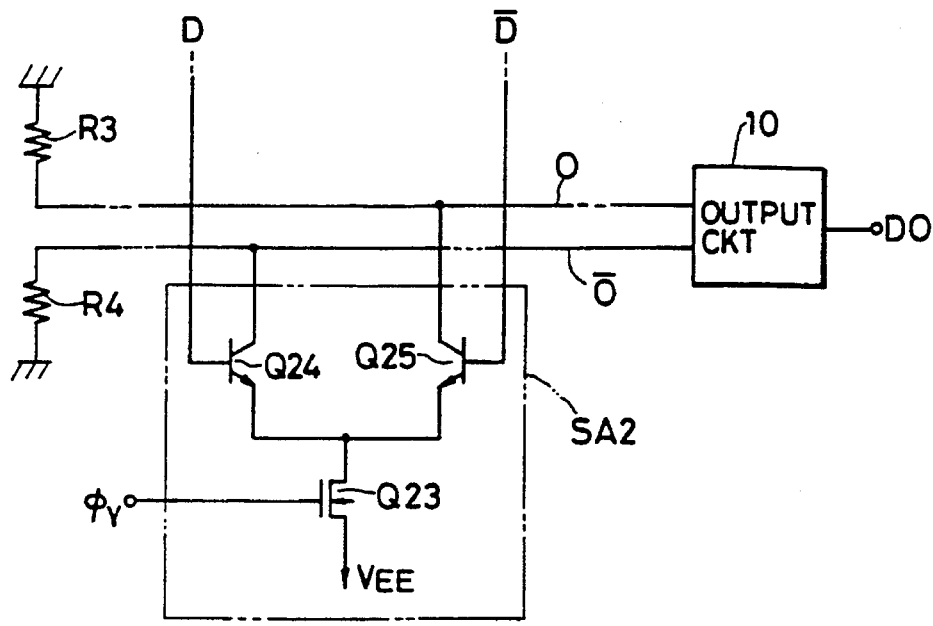

In FIG. 3A, the second differential amplifier is constituted by the MIS transistors. However, the second differential amplifier may be constituted to include bipolar transistors as shown in FIG. 6, if it can be enclosed within the data line pitch. If a pair of data lines are connected directly to base of the bipolar transistors as shown in FIG. 6, the voltage difference of the data lines can be detected more sensitively. However, being different from the case of connection to gate of the MIS transistor, base current of the bipolar transistor must be supplied from the data line. Since the base current cannot be sufficiently supplied by the stored charge of the memory cell, when the first differential amplifier SA1 is started and the supplying of the base current becomes possible, the second differential amplifier SA2 must be started. If the saturation of the bipolar transistors Q24, Q25 causes trouble, the level shift circuit may be installed in the data. lines D, $\overline{D}$.

Figure 7:
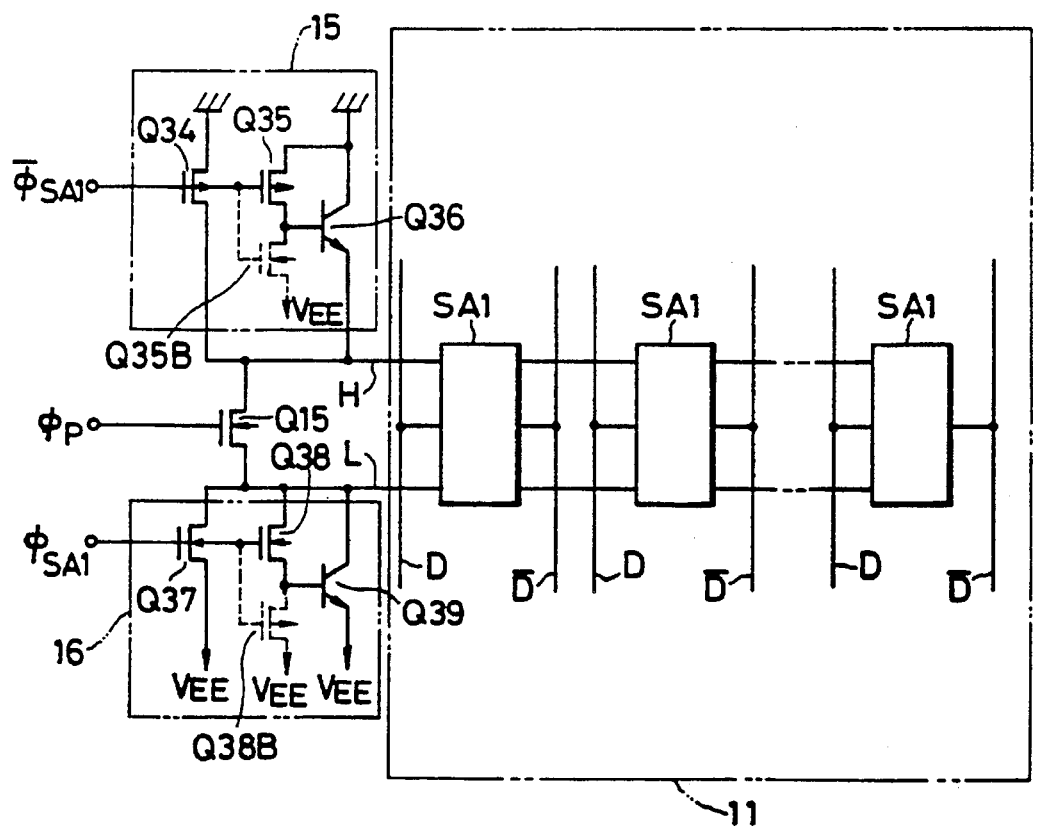

FIG. 7 shows a constitution example of the driving circuits 15, 16 of the first differential amplifier SA1 in FIG. 3A. In FIG. 7, the line H for charging is grounded through the P-channel MIS transistor Q34 and the bipolar transistor Q36, and the line L for discharging is connected through the N-channel MIS transistor Q37 and the bipolar transistor Q39 to the negative supply voltage $V_{EE}$. The MIS transistors Q35, Q38 for base current controlling are connected to base of the bipolar transistors Q36 and Q39 respectively. Since the precharge signal φp is at high level before the read operation as shown in FIG. 4, the line H for charging and the line L for discharging are shortcircuited by the N-channel MIS transistor Q15, thereby potential of the line H for charging and the line L for discharging becomes about ½ $V_{EE}$ and the first differential amplifier SA1 does not act then. The driving signal $\overline{\phi}$A1 is set to high level and the driving signal φSA1 is set to low level, and the MIS transistors Q34, Q37 and the bipolar transistors Q36, Q39 are made cut-off. Accordingly, even if the line H for charging and the line L for discharging are shortcircuited, the through current does not flow to the supply voltage $V_{EE}$. When the read operation is started and the precharge signal $\phi_p$ becomes low level and potential of the selected word line becomes high level thereby the small voltage difference is produced between the pair of data lines, the driving signal $\overline{\phi}$A1 is transferred to low level and the driving signal φSA1 is transferred to high level. As a result, the P-channel MIS transistors Q34 and Q35 are turned on, and current flows from the line H for charging to the data line at a higher level through the bipolar transistor Q36 and the MIS transistor Q34. Also the N-channel MIS transistors Q37 and Q38 are turned on, and current flows from the data line at a lower level through the line L for discharging to the negative supply voltage. Thus the voltage difference between the pair of data lines is amplified by the first differential amplifier SA1. Among the pair of data lines D, $\overline{D}$, the data line at a higher level attains to 0V and that at a lower level attains to $V_{EE}$. In the driving circuits 15, 16 shown in FIG. 7, since the MIS transistor and the bipolar transistor are arranged in parallel, the data line can be charged or discharged at high speed by the bipolar transistor, and final potential of the data line can be made equal to the supply voltage by the MIS transistor. Furthermore, the bipolar transistor having large driving capability is used, thereby the apparatus can be constituted at the small area in comparison to constitution by the MIS transistor only. The storage charge at base of the bipolar transistors Q36 and Q39 may degrade the operation speed. In this case, the N-channel MIS transistor Q35B and the P-channel MIS transistor Q38B shown by broken line may be added. Drain of the N-channel MIS transistor Q38 may be grounded so as to increase the base current of the bipolar transistor Q38. In this case, the bipolar transistor Q39 may be saturated. However, the saturation can be prevented by inserting of a resistor in the base, suitable selection of the mutual conductance gm of the MIS transistor Q38, or suitable selection of potential of the drain of Q38 between the negative supply voltage $V_{EE}$ and 0 V.

Figure 8:
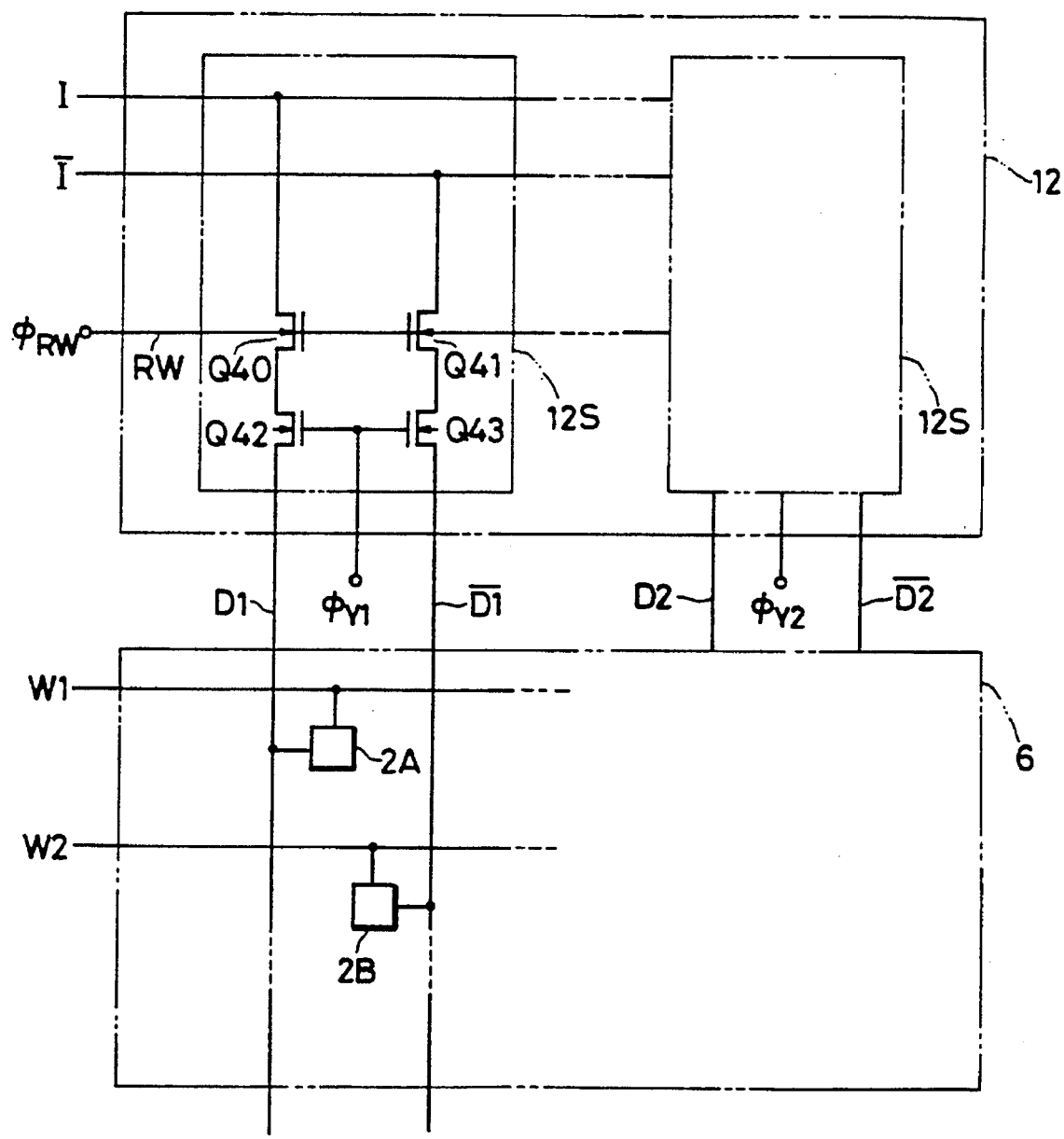
Figure 9:
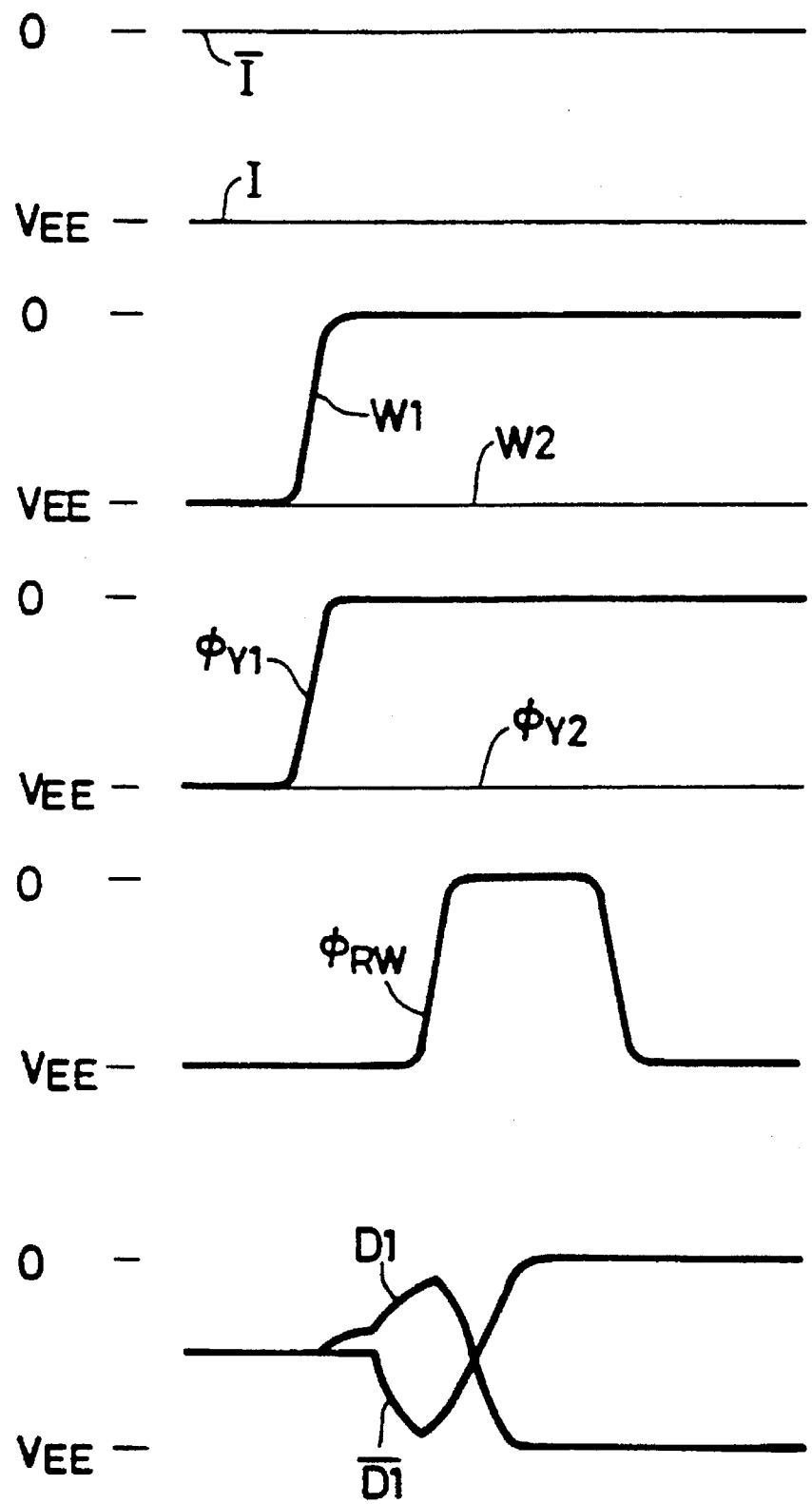

FIG. 8 shows a constitution example of the write circuit 12. The write circuit 12 is composed of a first input line I connected to the data lines D1, D2, a second input line $\overline{I}$ connected to the data lines D1, D2, and MIS transistors Q40–Q43 connected in series to a pair of data lines. When information stored in the memory cell 2A connected to the word line W1 and the data line D1 is rewritten from "1" into "0", operation of the write circuit 12 will be described referring to FIG. 9. When information "0" is written, potential of the write line I is made $V_{EE}$ and that of the line $\overline{I}$ is made 0 V. In this state, the read operation is started. If the read operation is started and potential of the word line W1 is transferred to high level, the voltage difference is produced between a pair of data lines and amplification of the voltage difference is started by the first differential amplifier. Then the write signal $\phi_{RW}$ is transferred to high level. As a result, potential of the pair of data lines D1, $\overline{D1}$ is transferred through the write lines I, $\overline{I}$ to low level and high level respectively, and the potential of the data line D1 is transferred to the memory cell 2A thereby the low level, i.e., "0" is written in the memory. In above-mentioned operation, even if the write signal φRW is transferred to high level, since the Y-select signal such as φY2 for the pair of data lines D2, $\overline{D2}$ with the no-select memory cell connected thereto is at low level, transistors corresponding to the MIS transistors Q42, Q43 connected to the data lines are cut off and therefore information is not written into the non-select memory connected to the word line W1. The write signal φRW is made by external control signal $\overline{WE}$ for write operation. The generating method of the signal φRW is known well and the description shall be omitted. In an example of write operation shown in FIG. 9, although operation of the first differential amplifier SA1 is started and then the write signal φRW is transferred to high level, timing of the signal φRW may be made earlier if necessary. Furthermore, if the write signal φRW and the selected word line remain to be at high level and the Y-select signal is changed, the write operation can be performed continuously to the memory cells connected to one word line. In this case, of course, the potential of the write lines I, $\overline{I}$ is changed corresponding to information to be written.

Figure 10:
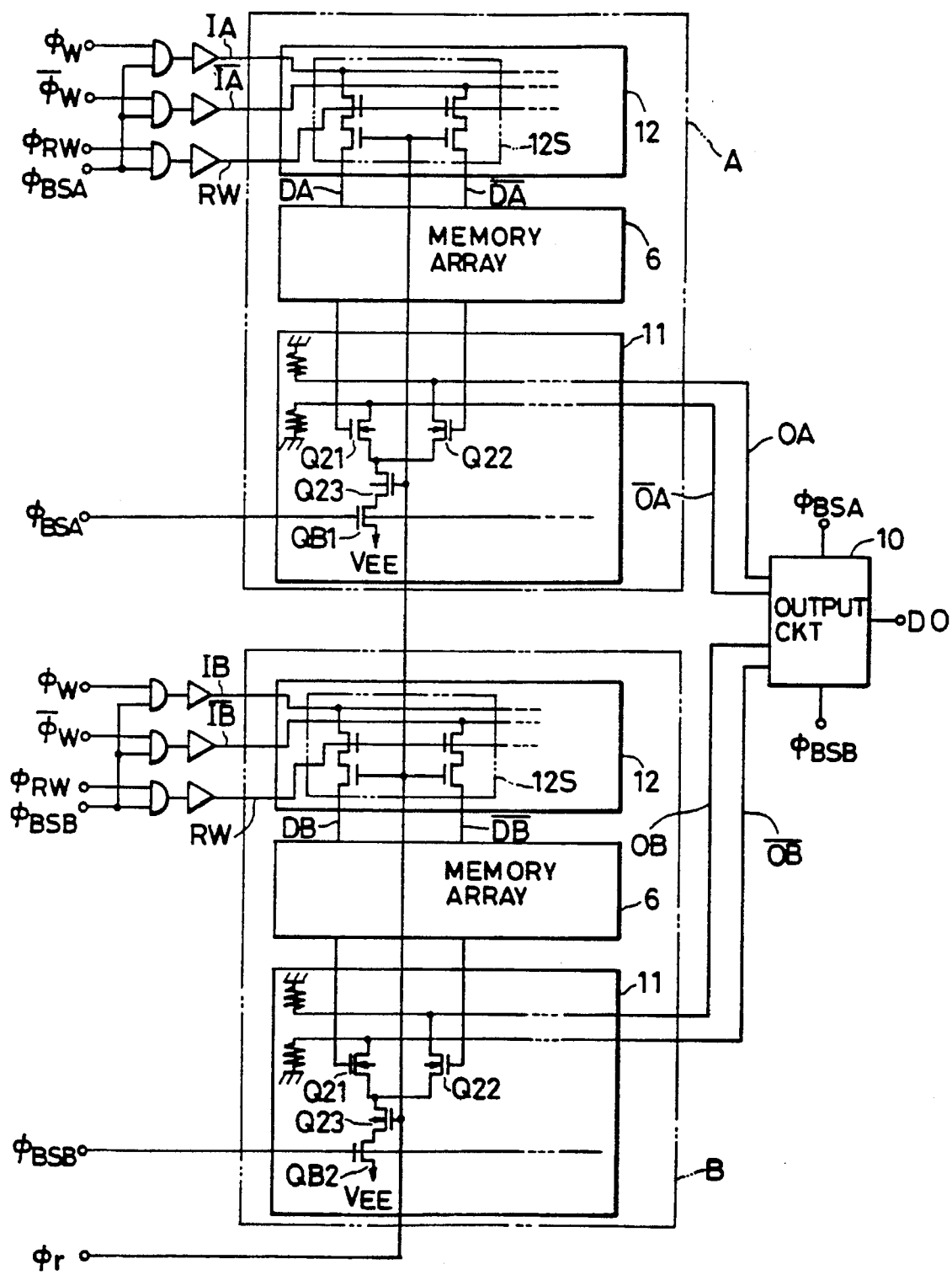
Figure 11:
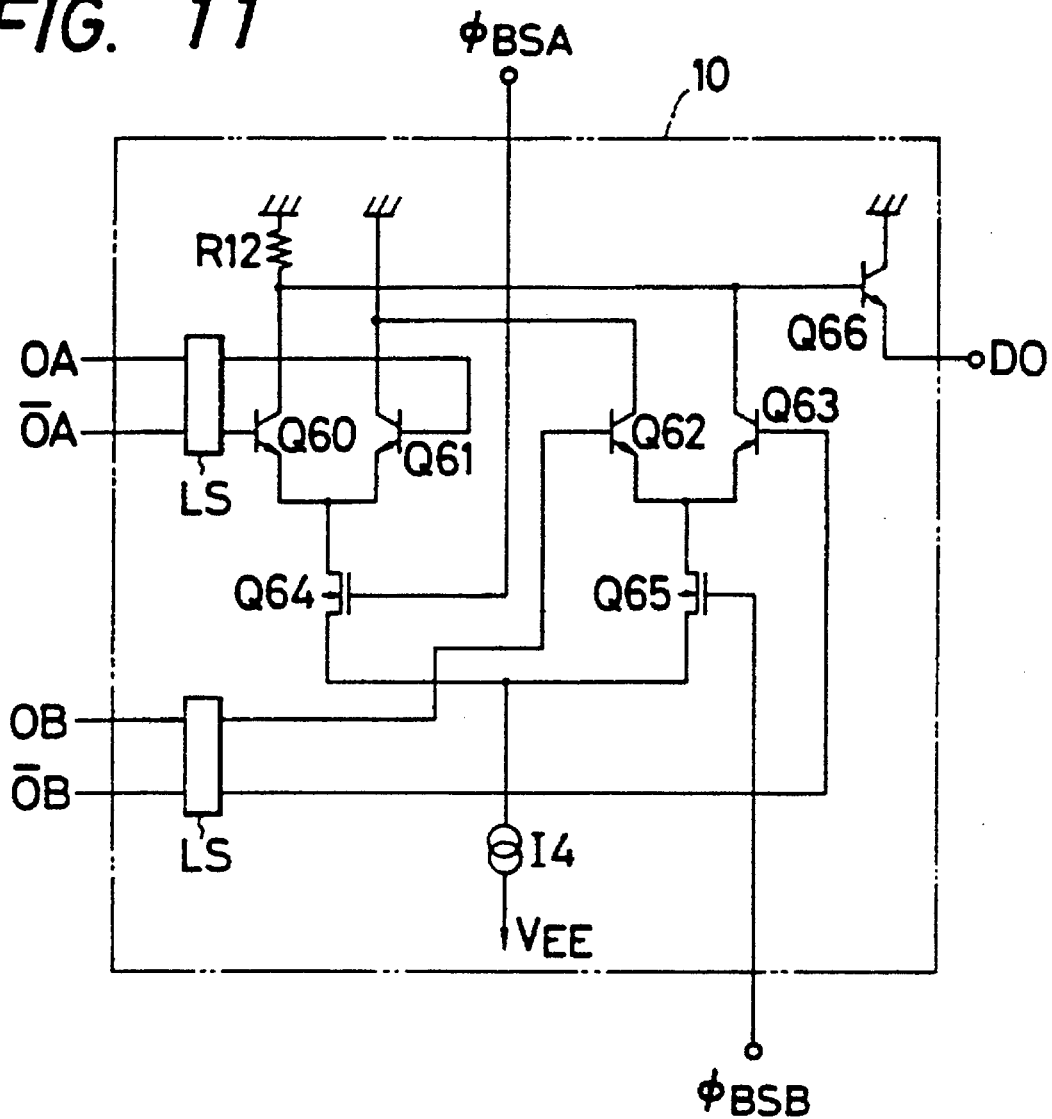
Figure 12:
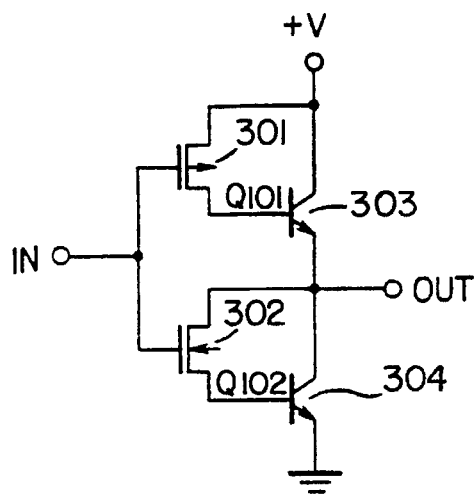
FIGS. 12–14 show prior art composite circuits including MOS and bipolar transistors.
Figure 13:
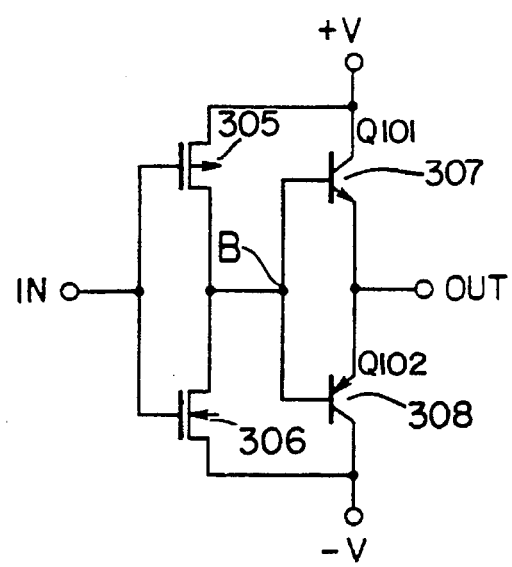
Figure 14:
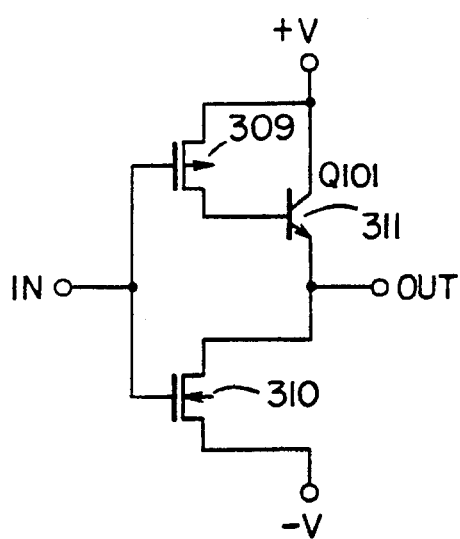
Figure 15:
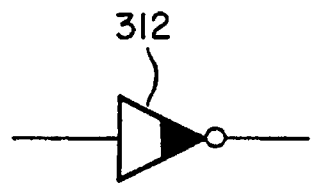
FIG. 15 shows a symbol for the circuits of FIGS. 12–14.
Figure 16:
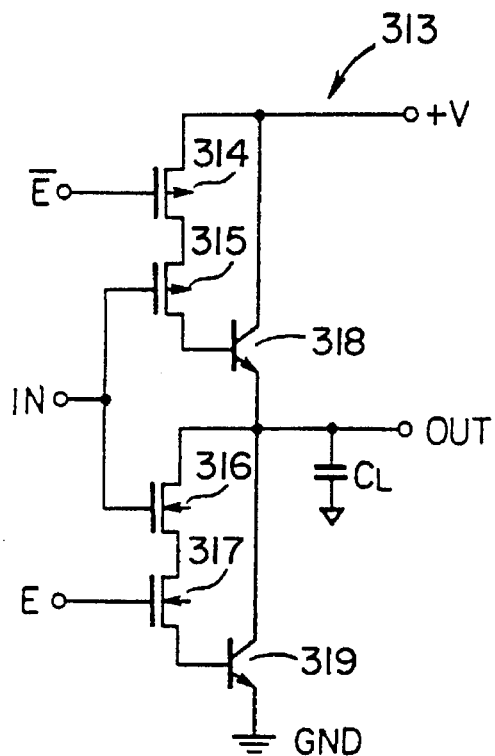
FIG. 16 shows another composite circuit.
Figure 17:
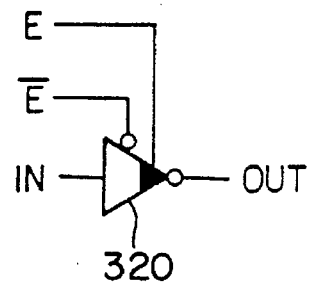
FIG. 17 shows a symbol for the circuit of FIG. 16.
Figure 18:
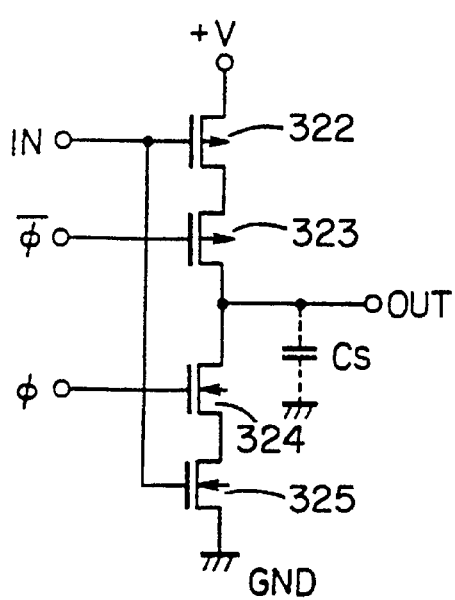
FIG. 18 shows a clocked inverter circuit.
Figure 19:
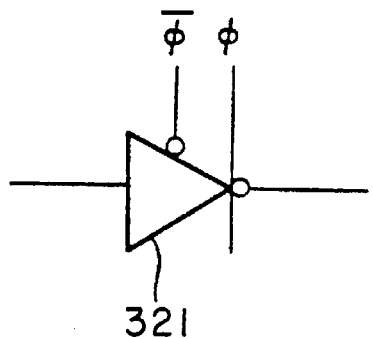
FIG. 19 shows a symbol for the circuit of FIG. 18.

As above described, the dynamic memory cell constituted by MIS transistors is used as memory cell, and peripheral circuits in which signals are transmitted to or received from the memory cell are constituted to include bipolar transistors, thereby a semiconductor memory of large capacity and high speed can be achieved. However, if the storage capacity is made significantly large, the data line becomes long and therefore the data line parasitic capacitance increases. As known well, the signal voltage Vsig read into the data line immediately before the amplification is proportional to $C_c/(C_C+C_D)$ wherein the memory cell capacitance is made $C_c$ and the data line parasitic capacitance is made $C_D$. Enlargement of the memory cell capacitance $C_c$ to compensate the enlargement of the data line parasitic capacitance $C_D$ is usually limited from the viewpoint of the integration. Consequently, as the data line parasitic capacitance $C_D$ increases, the signal voltage Vsig decreases. If the signal voltage Vsig decreases, not only the reliability is deteriorated but also the initial voltage difference inputted to the second differential amplifier SA2 decreases and the read performance speed is degraded. Furthermore, increase of the data line parasitic capacitance $C_D$ may cause increase of the re-write operation time by the first differential amplifier SA1. Problems accompanied with the increase of the data line parasitic capacitance $C_D$ have been pointed out also in a conventional semiconductor memory. In order to solve the problems, an effective system is proposed wherein the memory cell arrays are separately installed in the data line direction and the data lines are shared. System to share the data lines can be applied also to the dynamic semiconductor memory including bipolar transistors in the peripheral circuits according to the invention. FIG. 10 and FIG. 11 show a constitution example. In FIG. 10, the memory cell array is divided into two sub-arrays in the data line direction, and each of the sub-arrays is provided with the write circuit 12 and the sense circuit 11 thereby two blocks A and B are constituted. The output lines OA, $\overline{OA}$, OB, $\overline{OB}$ from each block are inputted to the output circuit 10 shown in FIG. 11. When the write operation or the read operation is performed, the Y-select signal $\phi Y$ passing through the array is concurrently applied to the write circuits 12S and the first differential amplifiers SA1 in a pair of data lines of the block A and a pair of data lines of the block B respectively. Which block should be selected is controlled by the block select signals $\phi_{BSA}$ and $\phi_{BSB}$ generated from the address signals. In the write operation, the write signal $\phi_{RW}$ and the input line driving signals $\phi_W$, $\overline{\phi}_W$ are applied to the write circuit 12 after the AND logic with the block select signals $\phi_{BSA}$ and $\phi_{BSB}$. In order to perform the write operation to the memory cell of the pair of data lines in the block A among pairs of data lines to which the Y-select signal $\phi_Y$ is applied, the block select signal $\phi_{BSA}$ may be made high level and the signal $\phi_{BSB}$ be made low level. In order to select the block B, the signal $\phi_{BSB}$ may be made high level and the signal $\phi_{BSA}$ be made low level. In the read operation, the N-channel MIS transistor is installed between the MIS transistor Q23 of the second differential amplifier SA2 and the negative supply voltage $V_{EE}$, and either of the second differential amplifiers SA2 is operated by the block select signal. For example, if the block select signal $\phi_{BSA}$ is made high level and the signal $\phi_{BSB}$ is made low level, the differential amplifier SA2 in the block A only is operated among the two differential amplifiers SA2 selected by $\phi_Y$ and the voltage difference is read into the output lines OA, $\overline{OA}$. The voltage difference read into the output lines OA, $\overline{OA}$ or OB, $\overline{OB}$ is transferred to the output circuit 20 in FIG. 11. In the output circuit 20, either of pairs of output lines from the two blocks is selected by the N-channel MIS transistors Q64, Q65 and then outputted. For example, if the block select signal $\phi_{BSA}$ is made low level and the signal $\phi_{BSB}$ is made high level, the MIS transistor Q64 is turned off and the transistor Q65 is turned on, thereby the voltage difference of the output lines OB, $\overline{OB}$ is amplified by the bipolar transistors Q62, Q63. In FIG. 11, symbol LS designates a level shift circuit for preventing bipolar transistor saturation. The level shift circuit LS serves to lower the potential of the output lines OA, $\overline{OA}$ and OB, $\overline{OB}$ without varying the voltage difference. The level shift circuit LS can be readily constituted using bipolar transistors in similar manner to the circuit of FIG. 3B that potential of the output lines O, $\overline{O}$ is lowered. Bipolar transistors may be used in place of the MIS transistors Q64, Q65. In this case, level of $\phi_{BSA}$, $\phi_{BSB}$ must be changed so as not to saturate the bipolar transistors.

In the embodiment as above described, the load resistor may be replaced by the MIS transistor, and other various modifications are possible. Also in the embodiment, potential of the data line is set to about half of the supply voltage, i.e., about ½ $V_{EE}$, before information is read into the data line. This system is effective to reduce the dissipation power. However, the invention can be applied also to system where potential of the data line is set to the positive supply voltage (0 V in ECL, and Vcc in TTL) as used in a dynamic semiconductor memory in the prior art. It is understood that various modifications may be made without departing from the spirit and scope of the invention.

According to the invention as above described, among the dynamic memory cells which can be constituted by a small number of MIS transistors, a memory cell is used which does not have a large current flowing in through the word line, and peripheral circuits are constituted to include bipolar transistors, whereby the area of the memory array is reduced, the large capacity is easily achieved, and the high-speed operation is possible utilizing the high driving capability and small signal detecting capability of bipolar transistors.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A dynamic random access memory comprising:

a memory cell;

a word line for accessing said memory cell;

a first data line crossing said word line for transferring a signal voltage from said memory cell;

a second data line crossing said word line;

a rewrite amplifier simultaneously coupled to said first and second data lines when amplifying a voltage difference between the signal voltage from said memory cell on said first data line and a voltage on said second data line, for rewriting the amplified voltage difference to said memory cell, wherein the memory cell is directly connected to said rewrite amplifier through said first data line;

a read sense circuit for sensing the voltage difference between the signal voltage from said memory cell on said first data line and the voltage on said second data line; and a common data line pair coupled to output terminals of said read sense circuit, wherein said read sense circuit has two insulated gate field-effect transistors, gates of which are respectively coupled to said first and second data lines to receive voltages thereon, and source/drain paths of which are coupled to said common data line pair, and wherein said read sense circuit is activated to sense the voltage difference between the signal voltage from said memory cell on said first data line and the voltage on said second data line and to provide an output to the common data line pair before said rewrite amplifier is activated to amplify the voltage difference between the signal voltage from said memory cell on said first data line and the voltage on said second data line.

2. A dynamic random access memory according to claim 1, wherein said memory cell is comprised of a transistor and a capacitor.

3. A dynamic random access memory according to claim 1, wherein a portion of the second data line at a point where it crosses the word line is directly connected to the rewrite amplifier through the second data line.

4. A dynamic random access memory according to claim 1, wherein the read sense circuit is directly connected to the memory cell through said first data line.

5. A dynamic random access memory according to claim 1, wherein said rewrite amplifier is comprised of a MISFET.

6. A dynamic random access memory according to claim 1, wherein said rewrite amplifier and said read sense circuit are each comprised of a plurality of MISFETs.

7. A dynamic random access memory according to claim 1, wherein said read sense circuit is controlled by a data line selector.

8. A dynamic random access memory according to claim 1, wherein the maximum voltage on said common data line pair is smaller than the maximum voltage difference between said first and second data lines.

9. A dynamic random access memory according to claim 1, further comprising means for limiting a voltage on said common data line pair.

10. A dynamic random access memory according to claim 1, wherein said read sense circuit is activated in a data writing operation.

11. A dynamic random access memory according to claim 1, further comprising a data line select decoder;
wherein said read sense circuit is selected by said data line select decoder.

12. A dynamic random access memory according to claim 1, further comprising first input terminals for receiving an address for selecting said word line; and
second input terminals for receiving an address for selecting said first and second data lines.

13. A dynamic random access memory according to claim 1, further comprising a write common data line pair coupled to the first and second data lines.

14. A dynamic random access memory according to claim 1, wherein a portion of the second data line at a point where it crosses the word line is directly connected to the read sense circuit through said second data line.

15. A dynamic random access memory according to claim 14, wherein the memory cell is directly connected to the read sense circuit through said first data line.

16. A dynamic random access memory according to claim 1, wherein said rewrite amplifier is coupled to a first line for charging and a second line for discharging, wherein said rewrite amplifier amplifies a voltage difference between said first and second data lines by connecting the first line for charging to whichever of the first and second data lines has a higher potential and connecting the second line for discharging to the other of said first and second data lines to thereby restore a stored potential in said memory cell.

17. A dynamic random access memory according to claim 16, wherein said rewrite amplifier comprises a first CMOS transistor pair comprising a first PMOS transistor and a first NMOS transistor having source/drain paths connected in series with one another between the first line for charging and the second line for discharging, and a second CMOS transistor pair comprising a second PMOS transistor and a second NMOS transistor having source/drain paths connected in series with one another between the first line for charging and the second line for discharging, wherein said first and second CMOS transistor pairs are in parallel with one another, and wherein gates of the first PMOS and NMOS transistors are coupled to a connecting node of the source/drain paths of the second PMOS and second NMOS transistors, and the gates of the second PMOS and NMOS transistors are coupled to a connecting node of the source/drain paths of the first PMOS and first NMOS transistors.

18. A dynamic random access memory according to claim 1, further comprising an output circuit for amplifying an output signal of said read sense circuit.

19. A dynamic random access memory according to claim 18, wherein said output circuit is comprised of bipolar transistors.

20. A dynamic random access memory comprising:

a memory cell;

a word line for accessing said memory cell;

a first data line crossing said word line for transferring a signal voltage from said memory cell;

a second data line crossing said word line;

a rewrite amplifier simultaneously coupled to said first and second data lines when amplifying a voltage difference between the signal voltage from said memory cell on said first data line and a voltage on said second data line, for rewriting the amplified voltage difference to said memory cell, wherein the memory cell is directly connected to said rewrite amplifier through said first data line;

a read sense circuit for sensing the voltage difference between the signal voltage from said memory cell on said first data line and the voltage on said second data line; and a common data line pair coupled to output terminals of said read sense circuit, wherein said read sense circuit has two insulated gate field-effect transistors, gates of which are respectively coupled to said first and second data lines to receive voltages thereon, and source/drain paths of which are coupled to said common data line pair, and wherein said read sense circuit is activated to sense the voltage difference between the signal voltage from said memory cell on said first data line and the voltage on said second data line and to provide an output to the common data line pair before said rewrite amplifier is activated to amplify the voltage difference between the signal voltage from said memory cell on said first data line and the voltage on said second data line;

wherein said memory cell is comprised of a transistor and a capacitor;

wherein a portion of the second data line at a point where it crosses the word line is directly connected to the rewrite amplifier and the read sense circuit through said second data line;

wherein the memory cell is directly connected to the read sense circuit through said first data line; and wherein said rewrite amplifier is coupled to a first line for charging and a second line for discharging, wherein said rewrite amplifier amplifies a voltage difference between said first and second data lines by connecting the first line for charging to whichever of the first and second data lines has a higher potential and connecting the second line for discharging to the other of said first and second data lines to thereby restore a stored potential in said memory cell.

21. A dynamic random access memory according to claim 20, wherein said rewrite amplifier comprises a first CMOS pair comprising a first PMOS transistor and a first NMOS transistor having source/drain paths connected in series with one another between the first line for charging and the second line for discharging, and a second CMOS pair comprising a second PMOS transistor and a second NMOS transistor having source/drain paths connected in series with one another between the first line for charging and the second line for discharging, wherein said first and second CMOS pairs are in parallel with one another, and wherein gates of the first PMOS and NMOS transistors are coupled to a connecting node of the source/drain paths of the second PMOS and second NMOS transistors, and the gates of the second PMOS and NMOS transistors are coupled to a connecting node of the source/drain paths of the first PMOS and second NMOS transistors.

22. A dynamic random access memory according to claim 20, wherein said read sense circuit is controlled by a data line selector.

23. A dynamic random access memory according to claim 20, wherein said rewrite amplifier is comprised of a MISFET.

24. A dynamic random access memory according to claim 23, wherein said rewrite amplifier and said read sense circuit are each comprised of a plurality of MISFETs.

25. A dynamic random access memory according to claim 20, further comprising an output circuit for amplifying an output signal of said read sense circuit.

26. A dynamic random access memory according to claim 25, wherein said output circuit is comprised of bipolar transistors.

* * * * *